(12) United States Patent
Lin

(10) Patent No.: US 9,859,112 B2
(45) Date of Patent: Jan. 2, 2018

(54) BONDED SEMICONDUCTOR STRUCTURES

(71) Applicant: Taiwan Semiconductor Manufacturing Co., LTD., Hsinchu (TW)

(72) Inventor: Jing-Cheng Lin, HsinChu (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 24 days.

(21) Appl. No.: 13/945,217

(22) Filed: Jul. 18, 2013

(65) Prior Publication Data
US 2015/0021741 A1  Jan. 22, 2015

(51) Int. Cl.
| | |
|---|---|
| *H01L 21/30* | (2006.01) |
| *H01L 21/02* | (2006.01) |
| *H01L 27/06* | (2006.01) |
| *H01L 21/822* | (2006.01) |
| *H01L 21/20* | (2006.01) |
| *H01L 23/48* | (2006.01) |
| *H01L 21/762* | (2006.01) |

(52) U.S. Cl.
CPC .... *H01L 21/02104* (2013.01); *H01L 21/8221* (2013.01); *H01L 27/0688* (2013.01); *H01L 21/2007* (2013.01); *H01L 21/76254* (2013.01); *H01L 23/481* (2013.01); *H01L 2924/0002* (2013.01); *H01L 2924/14* (2013.01)

(58) Field of Classification Search
CPC ......... H01L 21/76254; H01L 21/76259; H01L 21/76898; H01L 21/02104; H01L 27/0688; H01L 21/8211; H01L 23/481; H01L 2924/00; H01L 2924/0002; H01L 21/2007; H01L 2924/14

USPC ........ 438/455, 152, 153; 257/618, 202, 499, 257/E33.005
See application file for complete search history.

(56) References Cited

U.S. PATENT DOCUMENTS

| | | | | |
|---|---|---|---|---|
| 5,374,564 A * | 12/1994 | Bruel | ............... | H01L 21/76243 438/455 |
| 5,882,987 A * | 3/1999 | Srikrishnan | ....... | H01L 21/76251 148/DIG. 50 |
| 6,146,979 A * | 11/2000 | Henley | ................ | B81C 1/0038 257/E21.088 |
| 6,225,651 B1 * | 5/2001 | Billon | ............... | H01L 21/76898 257/190 |
| 6,600,173 B2 * | 7/2003 | Tiwari | ........................... | 257/74 |
| 7,018,910 B2 * | 3/2006 | Ghyselen | .......... | H01L 21/76254 257/E21.129 |

(Continued)

OTHER PUBLICATIONS

Celler, George and Michael Wolf, Sr., "Smart Cut™: A guide to the technology, the process, the products," SOITEC, Jul. 2003, <http://www.soitec.com/pdf/SmartCut_WP.pdf>.*

(Continued)

*Primary Examiner* — Thinh T Nguyen
(74) *Attorney, Agent, or Firm* — Maschoff Brennan

(57) ABSTRACT

A method is disclosed that includes the steps outlined below. An epitaxial layer is formed on a first semiconductor substrate. At least one implant species is implanted between the epitaxial layer and the first semiconductor substrate to form an ion-implanted layer. The epitaxial layer is bonded to a bonding oxide layer of a second semiconductor substrate. The first semiconductor substrate is separated from the ion-implanted layer.

21 Claims, 6 Drawing Sheets

(56) References Cited

U.S. PATENT DOCUMENTS

| | | | | |
|---|---|---|---|---|
| 2004/0053477 A1* | 3/2004 | Ghyselen et al. | ............ | 438/465 |
| 2007/0072391 A1* | 3/2007 | Pocas | .................... | H01L 21/187 |
| | | | | 438/455 |
| 2009/0224364 A1* | 9/2009 | Oh | ...................... | H01L 21/2007 |
| | | | | 257/532 |
| 2010/0289064 A1* | 11/2010 | Or-Bach et al. | .............. | 257/209 |
| 2012/0003815 A1* | 1/2012 | Lee | ....................... | H01L 21/268 |
| | | | | 438/458 |
| 2012/0248622 A1* | 10/2012 | Sadaka | ........................ | 257/774 |

OTHER PUBLICATIONS

Bruel et al., "Smart-Cut: A new silicon on insulator material technology based on hydrogen implantation and wafer bonding," Jpn. J. Appl. Phys., vol. 36 (1997), pp. 1636-1641.*

* cited by examiner

BONDED SEMICONDUCTOR STRUCTURES

FIELD

The present disclosure relates to a bonded semiconductor structure.

BACKGROUND

To attain higher performance and lower power consumption of an integrated circuit (IC) device, dimensions of the IC device are minimized. However, minimizing dimensions of the IC device makes it difficult and complicated to manufacture the IC device.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
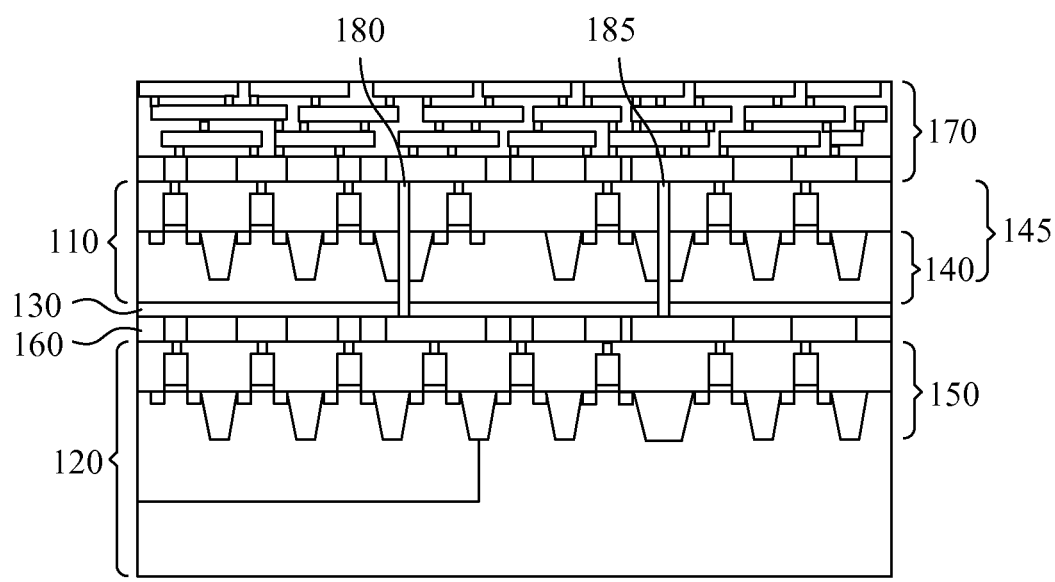
FIG. 1 is a cross sectional view of a semiconductor device in accordance with some embodiments of the present disclosure.

FIG. 1 is a cross sectional view of a semiconductor device 100 in accordance with some embodiments of the present disclosure.

In the semiconductor device 100, a first semiconductor substrate 110 is bonded to a second semiconductor substrate 120 through a bonding oxide layer 130.

The semiconductor substrate 110 includes an epitaxial layer 140 and a first semiconductor device portion 145 formed thereon. In some embodiments, the epitaxial layer 140 includes germanium (Ge), indium phosphide (InP), gallium arsenide (GaAs), or other suitable materials. In some embodiments, the first semiconductor device portion 145 includes integrated circuit (IC) components (not labeled) such as N-type metal-oxide semiconductor (NMOS) transistors, P-type metal-oxide semiconductor (PMOS) transistors, MOS capacitors, varactors, etc.

A second semiconductor device portion 150 is formed in the semiconductor substrate 120. Similar to the semiconductor device portion 145, the semiconductor device portion 150 includes IC components (not labeled) such as NMOS transistors, PMOS transistors, MOS capacitors, varactors, etc.

An interconnect layer 160 is provided between the semiconductor device portion 150 and the bonding oxide layer 130. The interconnect layer 160 connects different IC components in the semiconductor device portion 150 together. In some embodiments, the interconnect layer 160 includes at least one metal layer (not shown) and corresponding intermetal dielectric (IMD) layers (not shown). The interconnect layer 160 in FIG. 1 is for illustrative purposes. Various numbers and configurations of the metal layers and IMD layers in the interconnect 160 are within the contemplated scope of the present disclosure.

An interconnect layer 170 is formed on the semiconductor device portion 145. The interconnect layer 170 provides a similar function as the interconnect layer 160. Alternatively stated, the interconnect layer 170 connects different components in the semiconductor device portion 145 together. The interconnect layers 160 and 170 are shown differently in FIG. 1 to illustrate different embodiments.

Similar to the interconnect layer 160, the interconnect layer 170 in FIG. 1 is for illustrative purposes. Various numbers and configurations of the metal layers and corresponding IMD layers in the interconnect layer 170 are within the contemplated scope of the present disclosure.

Physically, each of the vias 180 and 185 contacts the interconnect layer 170, penetrates through the semiconductor device portion 145, the epitaxial layer 140 and the bonding oxide layer 130, and further contacts the interconnect layer 160. Electrically, the vias 180 and 185 connect the semiconductor device portion 145 and the semiconductor device portion 150 through the interconnect layer 170 and the interconnect layer 160. Effectively, the vias 180 and 185 form two electrical conduction paths each beginning from the semiconductor device portion 145, through the interconnect layer 170, the vias 180 and 185, the interconnect layer 160 and to the semiconductor device portion 150. Therefore, the IC components in the semiconductor device portion 145 are connected to the IC components in the semiconductor device portion 150 through the interconnect layer 170 and the interconnect layer 160. Two vias 180 and 185 are shown for illustration. A different number of vias is within the scope of the present disclosure.

In some embodiments, the thickness of the epitaxial layer 140 is 1-10 micrometers. Compared to the epitaxial layer having a thickness of 40-100 micrometers in other approaches, the epitaxial layer 140 is thin, and thus shortens the distance between the semiconductor device portion 145 and the semiconductor device portion 150. Accordingly, the electrical connections between the semiconductor device portion 145 and the semiconductor device portion 150 in the present disclosure are shortened. As a result, loss of electrical signals transmitted between the semiconductor device portion 145 and the semiconductor device portion 150 is reduced. The electrical performance between the semiconductor device portion 145 and the semiconductor device portion 150 is thus enhanced.

Further, in some embodiments, the diameter of the via 180 and/or 185 in FIG. 1 is less than 4 micrometers. In various embodiments, the diameter of the via 180 and/or 185 in FIG. 1 is less than 2 micrometers. The diameter of the via 180 and/or 185 is various when the via 180 and/or 185 is formed by various processes. The diameter of the via 180 or 185 is smaller than that of a via in other approaches, because the thickness of the epitaxial layer 140 is thinner, as described above. Compared to a via having a diameter that ranges from 5 to 6 micrometers in other approaches, extrusion caused by the via in other approaches is reduced and/or eliminated because the diameter of the via 180 or 185 in the present disclosure is smaller.

Because the epitaxial layer 140 is thinner and the vias 180 and 185 are shorter, the parasitic capacitance effect of the vias 180 and 185 is reduced. Because the parasitic capacitance effect is reduced, the diameters of the vias 180 and 185 are afforded to be smaller than those in other approaches. Furthermore, the smaller diameter and shorter length of the vias 180 and 185 result in a smaller volume. Accordingly, stresses caused by the vias 180 and 185 are decreased.

Figure 2:
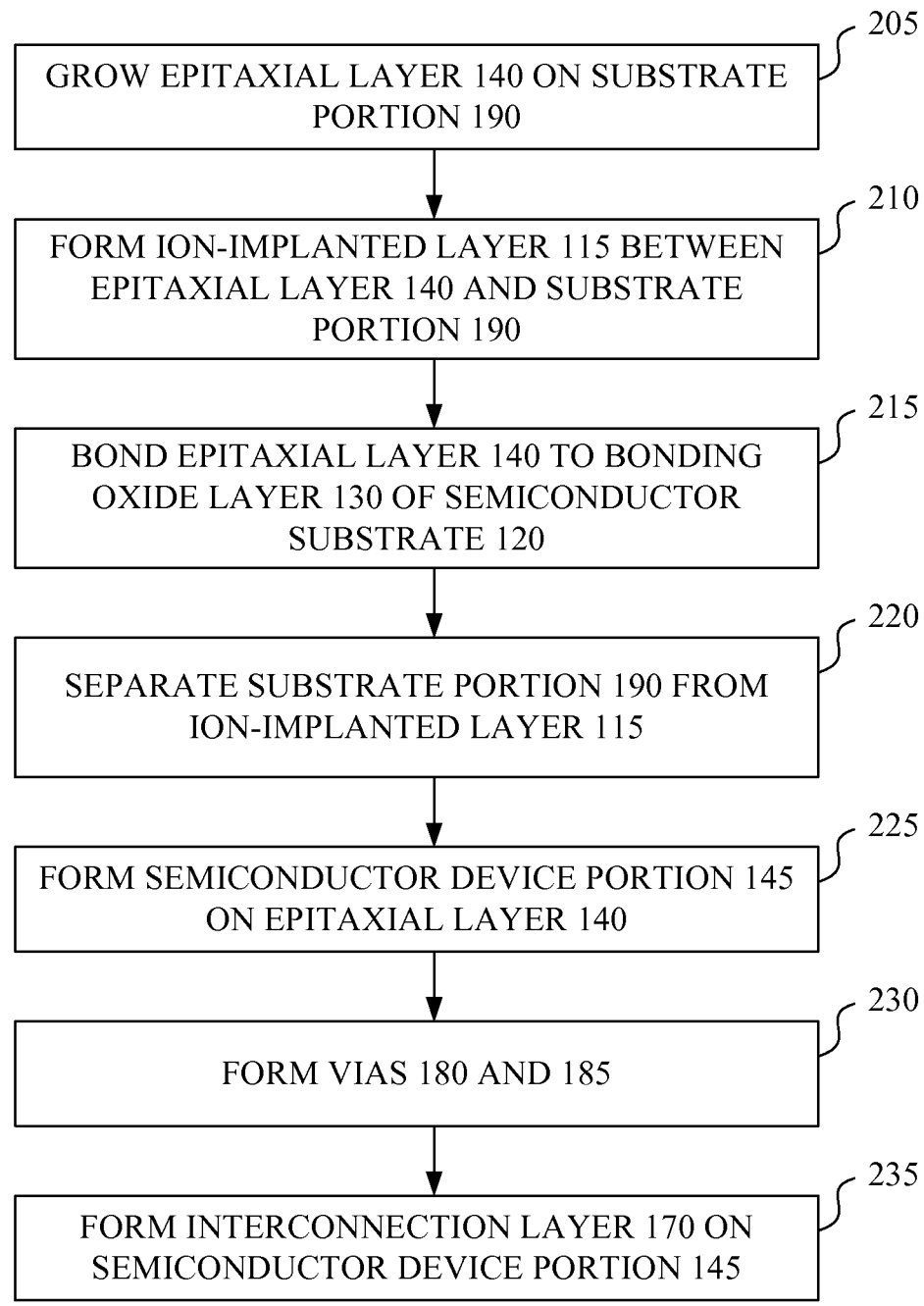
FIG. 2 is a flow chart of a method illustrating the manufacturing process of the semiconductor device in FIG. 1, in accordance with some embodiments of the present disclosure.

FIG. 2 is a flow chart of a method 200 illustrating the manufacturing process of the semiconductor device 100 in FIG. 1, in accordance with some embodiments of the present disclosure. For illustration, the manufacturing process of the semiconductor device 100 in FIG. 1 is described by the method 200 together with FIGS. 3A-3H.

FIGS. 3A-3H are cross sectional views of the semiconductor device 100 at different stages of a manufacturing process, in accordance with some embodiments of the present disclosure. After the different stages in FIGS. 3A-3H, the semiconductor device 100 has the cross sectional view in FIG. 1.

Figure 3A:
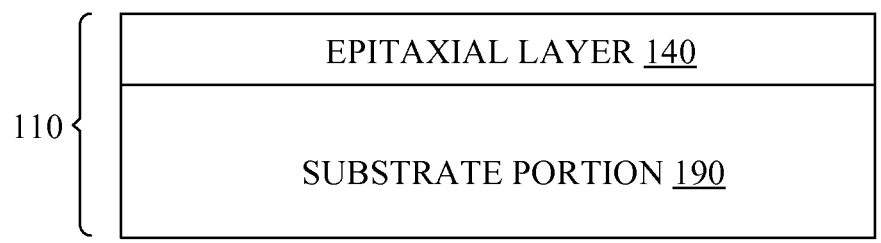
FIGS. 3A-3H are cross sectional views of the semiconductor device in FIG. 1 at different stages of a manufacturing process, in accordance with some embodiments of the present disclosure.

With reference to the method 200 in FIG. 2, in operation 205, an epitaxial layer 140 is grown on a substrate portion 190 in a semiconductor substrate 110, as illustrated in FIG. 3A. Effectively, the epitaxial layer 140 is a portion of the semiconductor substrate 110. Different epitaxial growth processes to form the epitaxial layer 140 on the substrate portion 190 are within the contemplated scope of various embodiments. The substrate portion 190 and the epitaxial layer 140 formed thereon are both provided without semiconductor device therein. In some embodiments, the semiconductor substrate 110 is a silicon (Si) substrate, and, for simplicity, is shown without semiconductor device therein. Other types of substrate are with the contemplated scope of the disclosure.

In some embodiments, an additional oxide layer (not labeled) is formed on the epitaxial layer 140, and is provided for a bonding operation explained below in operation 215.

Figure 3B:
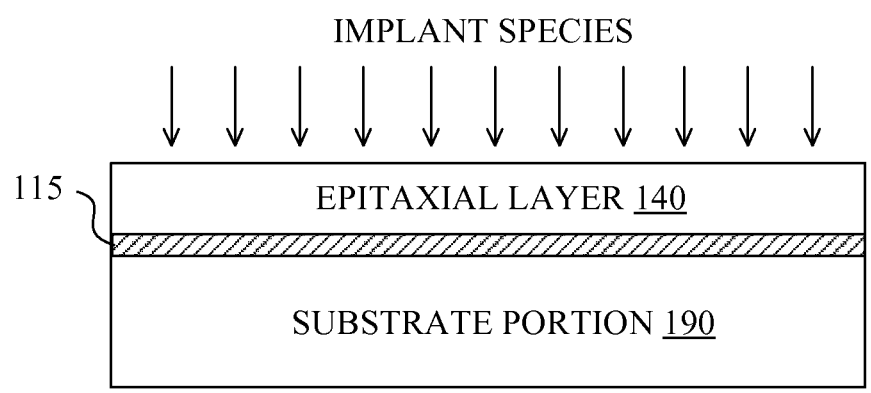

In operation 210, an ion-implanted layer 115 is formed between the epitaxial layer 140 and the substrate portion 190 as illustrated in FIG. 3B, by implanting at least one implant species over the epitaxial layer 140. In some embodiments, the implant species includes Helium (He), hydrogen (H), the combinations thereof, or other suitable materials. Different doses of the implant species, ion-implantation energies and temperatures in the ion-implantation processes are used according to the desired depth of the ion-implanted layer 115, and are within the contemplated scope of various embodiments.

In some embodiments, the ion-implanted layer 115 includes micro bubbles (not shown) from the species implant. The micro bubbles are used for the epitaxial layer 140 and the substrate portion 190 to be subsequently split into two distinctive components. Effectively, the substrate portion 190 is easily exfoliated from the epitaxial layer 140 in the subsequent step of the manufacturing process.

Figure 3C:
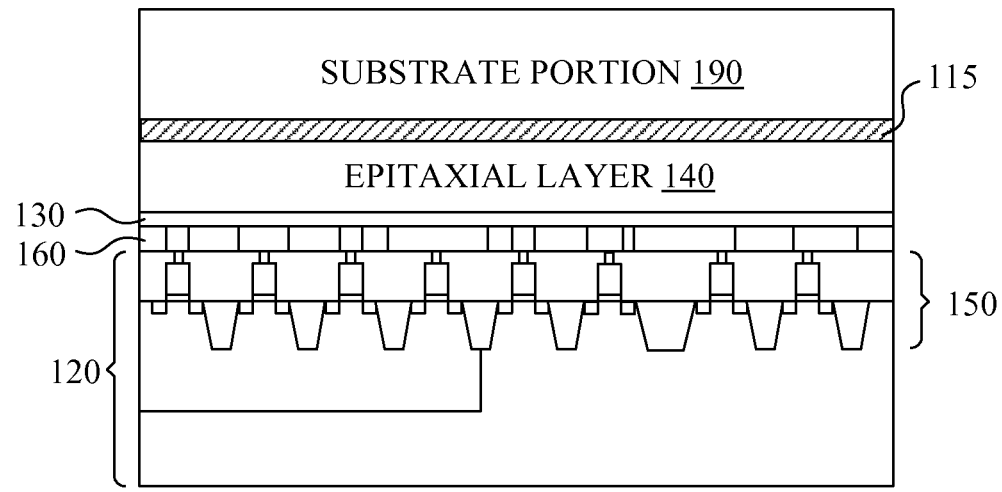

In operation 215, the epitaxial layer 140 is bonded to the semiconductor substrate 120 through a bonding oxide layer 130, as illustrated in FIG. 3C. In some embodiments, the semiconductor substrate 120 includes the semiconductor device portion 150 and the interconnect layer 160. The interconnect layer 160 is between the bonding oxide layer 130 and the semiconductor device portion 150.

In some embodiments, the epitaxial layer 140 is bonded to the bonding oxide layer 130 through the additional oxide layer (not labeled) which is previously introduced at the stage in FIG. 3A. Effectively, the additional oxide layer formed on the epitaxial layer 140 provides a stronger bonding strength to bond the epitaxial layer 140 with the bonding oxide layer 130.

Figure 3D:
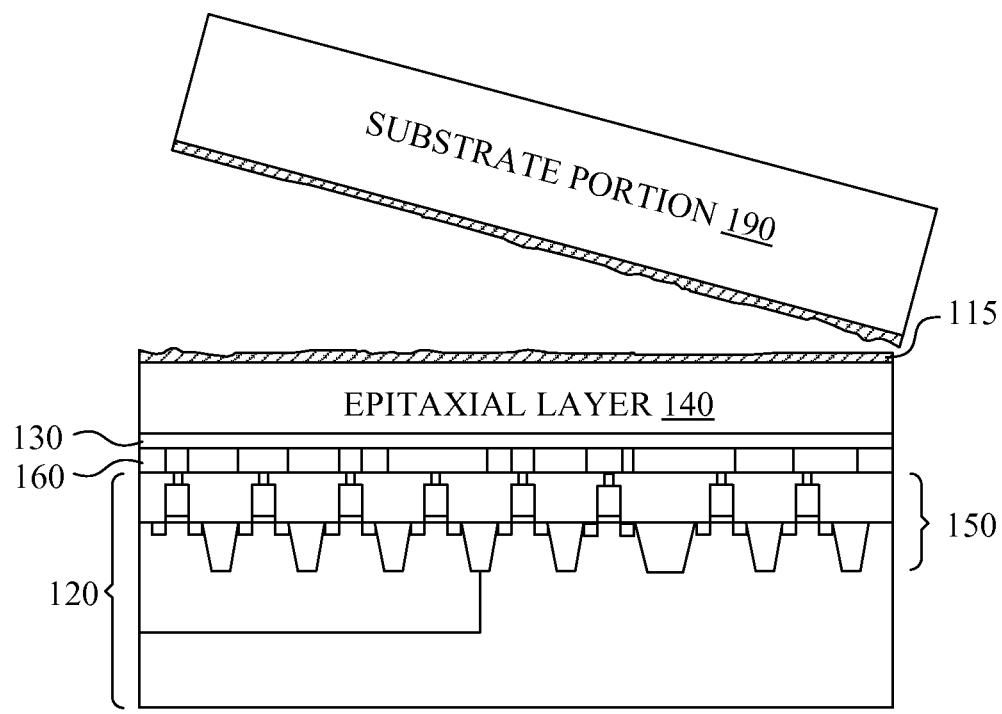

In operation 220, the substrate portion 190 is separated from the ion-implanted layer 115, as illustrated in FIG. 3D.

Figure 3E:
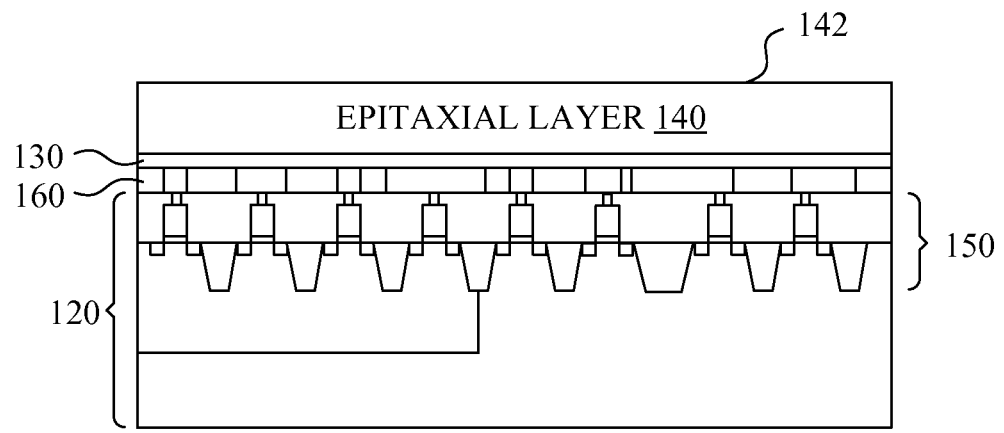

In some embodiments, the surface 142 of the epitaxial layer 140 is polished to remove the remaining ion-implanted layer 115, as illustrated in FIG. 3E. For example, the surface of the epitaxial layer 140 is polished by a chemical mechanical polishing (CMP) process. Other methods to polish the surface of the epitaxial layer 140 are within the contemplated scope of the present disclosure.

Figure 3F:
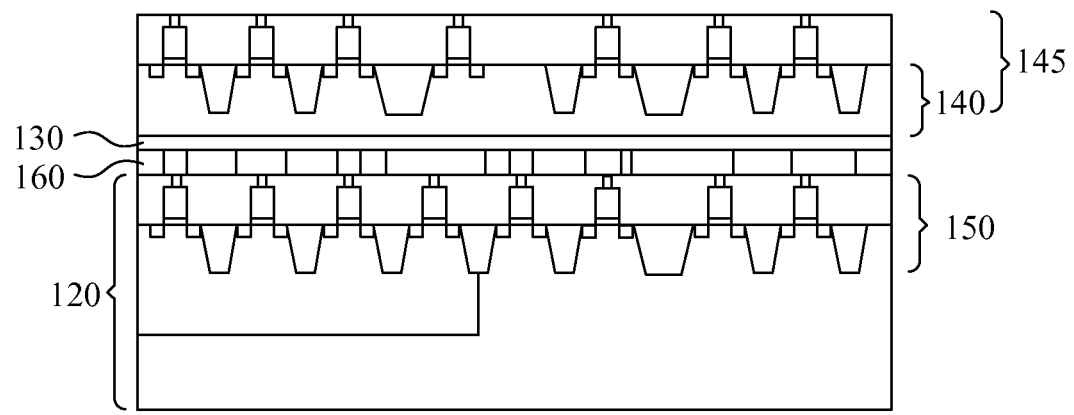

In operation 225, a semiconductor device portion 145 is formed on the epitaxial layer 140, as illustrated in FIG. 3F.

Figure 3G:
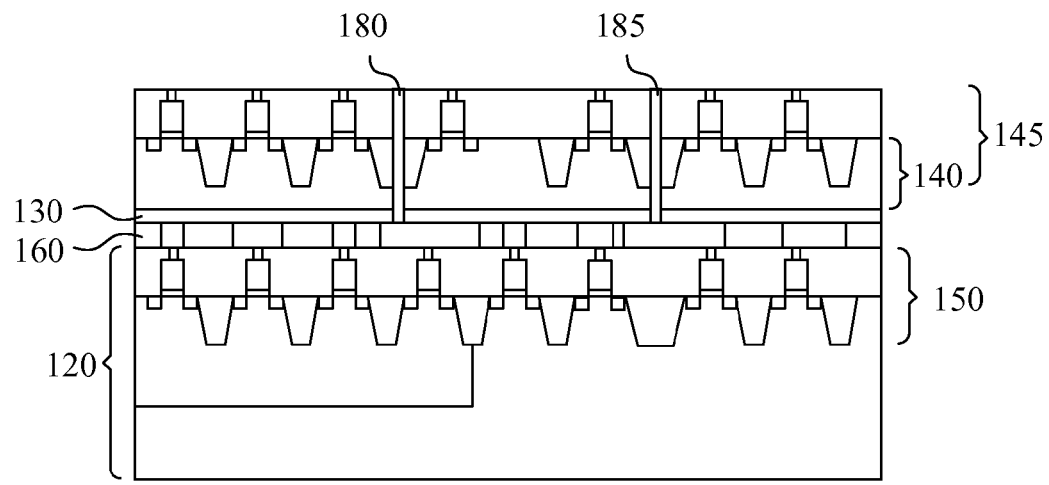

In operation 230, vias 180 and 185 are formed to penetrate through the semiconductor device portion 145, the epitaxial layer 140, and the bonding oxide layer 130 to contact the interconnect layer 160, as illustrated in FIG. 3G.

Figure 3H:
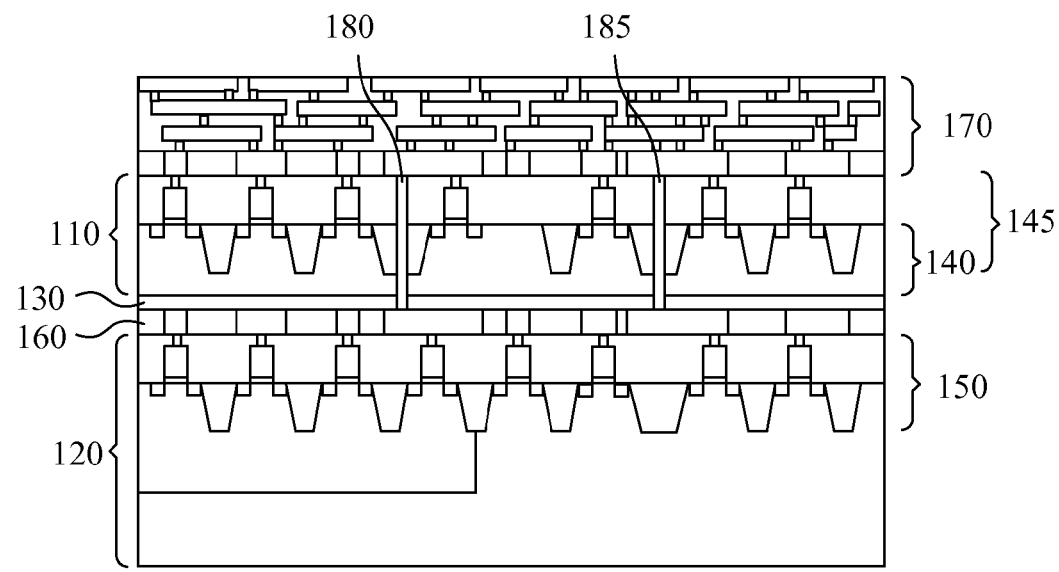

In operation 235, an interconnect layer 170 is formed on the semiconductor device portion 145, as illustrated in FIG. 3H. The cross sectional view of the semiconductor device 100 in FIG. 3H is the cross sectional view of the semiconductor device 100 FIG. 1.

In some embodiments, a method is disclosed that includes the steps outlined below. An epitaxial layer is formed on a first semiconductor substrate. At least one implant species is implanted between the epitaxial layer and the first semiconductor substrate to form an ion-implanted layer. The epitaxial layer is bonded to a bonding oxide layer of a second semiconductor substrate. The first semiconductor substrate is separated from the ion-implanted layer.

Also disclosed is a method that includes the steps outlined below. An epitaxial layer is bonded on a first semiconductor substrate to a bonding oxide layer of a second semiconductor substrate, wherein the epitaxial layer and the first semiconductor substrate comprises an ion-implanted layer in between. The first semiconductor substrate is separated from the ion-implanted layer. A first semiconductor device portion is formed on the epitaxial layer. At least one via is formed through the first semiconductor device portion, the epitaxial layer, and the bonding oxide layer. An interconnect layer on the first semiconductor device portion is formed.

Also disclosed is a semiconductor device that includes a first semiconductor substrate, a second semiconductor substrate and a bonding oxide layer. The first semiconductor substrate includes an epitaxial layer. The bonding oxide layer bonds the first semiconductor substrate and the second semiconductor substrate.

In this document, the term "connected" may be termed as "electrically connected", and the term "coupled" may be termed as "electrically coupled". "Connected" and "coupled" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method, comprising:
   implanting at least one implant species between a first semiconductor substrate and an epitaxial layer which is formed on the first semiconductor substrate, to form an ion-implanted layer which is in contact with and disposed between the epitaxial layer and the first semiconductor substrate;
   after implanting the at least one implant species between the first semiconductor substrate and the epitaxial layer, without forming any layer on the epitaxial layer, bonding the epitaxial layer to a bonding oxide layer of a second semiconductor substrate; and
   removing the first semiconductor substrate together with a portion of the ion-implanted layer from a remaining portion of the ion-implanted layer and the epitaxial layer, without removing any portion of the epitaxial layer, to separate the first semiconductor substrate from the epitaxial layer.

2. The method of claim 1, further comprising:
   forming a first semiconductor device portion on the epitaxial layer.

3. The method of claim 1, further comprising:
   polishing the epitaxial layer by removing the remaining portion of the ion-implanted layer from the epitaxial layer, after separating the first semiconductor substrate from the epitaxial layer.

4. The method of claim 1, wherein a thickness of the epitaxial layer is in a range of 1-10 micrometers.

5. The method of claim 2, wherein the second semiconductor substrate comprises a second semiconductor device portion.

6. The method of claim 5, wherein the second semiconductor device portion is capped by the bonding oxide layer.

7. The method of claim 5, further comprising:
   forming at least one via through a second semiconductor device portion formed on the epitaxial layer, the epitaxial layer, and the bonding oxide layer, for connecting the first semiconductor device portion and the second semiconductor device portion.

8. The method of claim 7, further comprising:
   forming an interconnect layer on the second semiconductor device portion.

9. The method of claim 7, wherein a diameter of the at least one via is less than 4 micrometers.

10. The method of claim 1,
    wherein the epitaxial layer is bonded to the bonding oxide layer of the second semiconductor substrate through a first oxide layer introduced from the epitaxial layer.

11. The method of claim 1, wherein the at least one implant species comprises at least one of He and H.

12. The method of claim 1, wherein the epitaxial layer comprises at least one of Ge, InP and GaAs.

13. A method, comprising:
    forming an ion-implanted layer which is in contact with and disposed between a first semiconductor substrate and an epitaxial layer which is formed on the first semiconductor substrate, by implanting at least one implant species over the epitaxial layer;
    after forming the ion-implanted layer, without forming any layer on the epitaxial layer, bonding the epitaxial layer on the first semiconductor substrate to a bonding oxide layer of a second semiconductor substrate;
    removing the first semiconductor substrate together with a portion of the ion-implanted layer from a remaining portion of the ion-implanted layer and the epitaxial layer, without removing any portion of the epitaxial layer, to separate the first semiconductor substrate from the epitaxial layer;
    forming a first semiconductor device portion on the epitaxial layer;
    forming at least one via through the first semiconductor device portion, the epitaxial layer, and the bonding oxide layer; and
    forming an interconnect layer on the first semiconductor device portion.

14. The method of claim 13, further comprising:
    polishing the epitaxial layer by removing the remaining portion of the ion-implanted layer from the epitaxial layer, after separating the first semiconductor substrate from the epitaxial layer.

15. The method of claim 13, wherein a thickness of the epitaxial layer is in a range of 1-10 micrometers.

16. The method of claim 13, wherein a diameter of the at least one via is less than 4 micrometers.

17. The method of claim 13,
    wherein the epitaxial layer is bonded to the bonding oxide layer of the second semiconductor substrate through a first oxide layer introduced from the epitaxial layer.

18. The method of claim 13, wherein the epitaxial layer comprises at least one of Ge, InP and GaAs.

19. The method of claim 1, further comprising:
    forming an interconnect layer between the bonding oxide layer and a semiconductor device portion of the second semiconductor substrate,
    wherein the at least one via penetrates through the semiconductor device portion, the epitaxial layer, and the bonding oxide layer of the second semiconductor substrate, to contact the interconnect layer.

20. The method of claim 13, further comprising:
forming a second interconnect layer between the bonding oxide layer and a second semiconductor device portion of the second semiconductor substrate,
wherein the at least one via penetrates through the first semiconductor device portion, the epitaxial layer, and the bonding oxide layer of the second semiconductor substrate, to contact the second interconnect layer.

21. A method, comprising:
forming an ion-implanted layer which is in contact with and disposed between a first semiconductor substrate and an epitaxial layer which is formed on the first semiconductor substrate, by implanting at least one implant species over the epitaxial layer, wherein a thickness of the epitaxial layer is in a range of 1-10 micrometers;
after forming the ion-implanted layer, without forming any layer on the epitaxial layer, bonding the epitaxial layer on the first semiconductor substrate to a bonding oxide layer of a second semiconductor substrate through a first oxide layer introduced from the epitaxial layer;
removing the first semiconductor substrate together with a portion of the ion-implanted layer from a remaining portion of the ion-implanted layer and the epitaxial layer, without removing any portion of the epitaxial layer, to separate the first semiconductor substrate from the epitaxial layer;
forming a first semiconductor device portion on the epitaxial layer;
forming vias through the first semiconductor device portion, the epitaxial layer, and the bonding oxide layer, wherein a diameter of each one of the vias is less than 4 micrometers;
forming a first interconnect layer on the first semiconductor device portion; and
forming a second interconnect layer between the bonding oxide layer and a second semiconductor device portion of the second semiconductor substrate,
wherein the vias penetrate through the first semiconductor device portion, the epitaxial layer, and the bonding oxide layer of the second semiconductor substrate, to contact the second interconnect layer.

* * * * *